US006904571B1

(12) United States Patent
Schmidt et al.

(10) Patent No.: US 6,904,571 B1
(45) Date of Patent: Jun. 7, 2005

(54) ALGORITHM AND METHODOLOGY FOR THE POLYGONALIZATION OF SPARSE CIRCUIT SCHEMATICS

(75) Inventors: Dominik J. Schmidt, San Jose, CA (US); Perry Chun, Milpitas, CA (US); Richard C. Saito, Sunnyvale, CA (US); Eugene Y. Chen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 379 days.

(21) Appl. No.: 10/234,411

(22) Filed: Sep. 3, 2002

Related U.S. Application Data

(62) Division of application No. 08/840,558, filed on Apr. 14, 1997, now Pat. No. 6,480,995.
(60) Provisional application No. 60/024,948, filed on Aug. 30, 1996, and provisional application No. 60/015,990, filed on Apr. 15, 1996.

(51) Int. Cl.[7] .............................................. G06F 17/50
(52) U.S. Cl. ................................ 716/2; 716/8; 716/11; 716/14; 716/15
(58) Field of Search ........................... 716/2, 8, 11, 14, 716/15

(56) References Cited

U.S. PATENT DOCUMENTS

| 5,051,938 A | | 9/1991 | Hyduke |
| 5,097,422 A | * | 3/1992 | Corbin et al. .................. 716/8 |
| 5,218,551 A | | 6/1993 | Agrawal et al. |
| 5,231,590 A | | 7/1993 | Kumar et al. |
| 5,381,343 A | | 1/1995 | Bamji |
| 5,402,357 A | | 3/1995 | Schaefer et al. |
| 5,452,224 A | | 9/1995 | Smith, Jr. et al. |
| 5,459,673 A | | 10/1995 | Carmean et al. |
| 5,461,579 A | | 10/1995 | Misheloff et al. |
| 5,463,563 A | | 10/1995 | Bair et al. |
| 5,490,095 A | | 2/1996 | Shimada et al. |
| 5,604,680 A | | 2/1997 | Bamji |
| 5,798,937 A | | 8/1998 | Bracha et al. |
| 5,822,214 A | | 10/1998 | Rostoker |

OTHER PUBLICATIONS

Altera Corp., "Max + Plus II, Programmable Logic Development System & Software," Data Book, Mar. 1995, Version 6, pp. 511–531.

Altera Corp. "EDA Software Support," Data Book 1995, pp. 549–561.

Xilinx Corp., "Development Systems," The Programmable Logic Data Book, 1994, pp. 7–1 to 7–38.

* cited by examiner

*Primary Examiner*—Thuan Do
(74) *Attorney, Agent, or Firm*—Townsend and Townsend and Crew LLP

(57) ABSTRACT

An method of creating a physical layout of an integrated circuit. A schematic file (600) is mapped directly to a physical layout using the location of elements and routing of interconnections as specified in the schematic file (600). The method takes advantage of constraints on the schematic design to provide the layout file (675) quickly, without complex routing programs. Design rules violations are anticipated and corrected in some cases. In other cases, the design rule violations are annotated, if the designer intentionally placed them in the design.

6 Claims, 18 Drawing Sheets

ALGORITHM AND METHODOLOGY FOR THE POLYGONALIZATION OF SPARSE CIRCUIT SCHEMATICS

This application is a divisional of U.S. patent application Ser. No. 08/840,558 filed Apr. 14, 1997, now U.S. Pat. No. 6,480,995, which claims the benefit of U.S. Provisional Patent Application 60/015,990 filed Apr. 15, 1996 and U.S. Provisional Patent Application 60/024,948 filed Aug. 30, 1996.

COPYRIGHT NOTICE

A portion of the disclosure of this patent document contains material that is subject to copyright protection. The copyright owner has no objection to the xerographic reproduction by anyone of the patent document or the patent disclosure in exactly the form it appears in the Patent and Trademark Office patent file or records, but otherwise reserves all copyright rights whatsoever.

APPENDIX

Microfiche Appendix A comprising 2 sheets and 105 frames is included in this application.

BACKGROUND OF THE INVENTION

This invention relates generally to the field of integrated circuits. More specifically, the present invention relates to a system for designing physical layouts of integrated circuits.

When designing an integrated circuit, a designer will use various design tools to describe the elements and functions that will be incorporated into the device. For example, the designer may use a hardware description language such as VHDL. A hardware description language allows the designer to describe the functions that are to be performed, without necessarily specifying what elements to use to perform the function. Software tools are available to translate the hardware description language into a gate level design that specifies each element. Alternatively, the designer may enter the gate level design directly. For example, drawing tools are available for entering gate level designs. Such a design may be represented by a schematic that has symbols to identify each element in the design. In the schematic, every element that is intentionally in the design is represented by a symbol. Generation of the schematic may be accomplished manually or automatically.

In order to fabricate the integrated circuit, the schematic is translated into a physical layout. The physical layout is a description of how the design will be fabricated in the actual device. In other words, it is a physical representation of the elements in the schematic. Generating a physical layout is a time consuming process. Electronic design automation tools exist to generate a physical transistor layout with uniform gates. These types of gates are known as standard cells. However, in the case of non-standard cells, or custom cells, the layout engineer generates the physical transistor layout manually, for instance, by drawing it on a computer. For a typical integrated circuit, the time for generating a custom layout is measured in months.

The electronic design automation tools that are available to generate the physical layout from a schematic representation, typically divide the schematic design into sets of resources and nets. Each element and I/O port is defined as a resource and each connection between elements is defined as a net. For example, a transistor, a capacitor, I/O pad, or a resistor may be a resource and the connections between them may be nets.

The software places the resources among the standard cells in a layout and routes the nets between them. It will typically attempt to place the resources and nets such that a minimal area is consumed and the net lengths are minimized. Many different algorithms have been used to find the best placement and routing. However, as will be recognized, this is a well-known and difficult mathematics problem known as "The Traveling Salesman" problem. The solution to this problem is N-P complete. As such, an optimal solution is not possible in a reasonable amount of time when the number of resources and nets is high.

Because of their complexity, electronic design automation tools are typically very expensive and time consuming to run. The layouts they provide are generally of marginal efficiency. A human being can often place and route items much more efficiently. The results of these electronic design automation tools may need to be reworked manually to remove inefficiencies or for other reasons. Furthermore, these tools are especially not well-suited for designs that do not have many repeatable elements. Full-custom design is often in this category.

While there may be times that an electronic design automation tools of the type currently available today may be desirable, often their use is not desirable. Many improvements to accelerate the design process, improve the results, and give designers more control over the final layout are needed. In addition, for example, one area of concern in the integrated circuit industry is the design of test chips. A test chip is one that is typically used by integrated circuit manufacturer to determine the operating characteristics of certain devices, elements, or structures. Test chips may be used to test the fabrication processes and create models of the various elements used in the integrated circuits. These test chips generally have relatively few number of elements compared with a high number of input and output pads. Due to the nature of a test chip, it will generally have few repeating elements. In the specific example of test chips, the efficiency of the wiring and use of area in the layout is not as important as the speed with which the test chip can be created. In the past, it has sometimes taken months to produce such a test chip by hand.

Another example of when existing design tools may not be appropriate is when the circuit is small and density of design is not as important as the speed of completing the design. Often, only a small window of opportunity is given in the marketplace. It is more important to get a product out quickly, than to have a design that is designed in the smallest possible area. For such a situation, manual layout is not an good option because of time constraints, and autorouting software is not a good option because it adds a burdensome expense.

It is therefore desirable to have a new layout system for automatically generating a physical layout.

SUMMARY OF THE INVENTION

A method of creating a layout design for an integrated circuit is disclosed wherein a schematic having elements and interconnections between the elements is automatically translated to a layout design. In the layout design, geometrics corresponding to the elements of the schematic are created and placed such that the positional relationship between the geometries are substantially similar to the positional relationship of the corresponding elements in the schematic. Geometries corresponding to the interconnections are also made. The interconnection geometries may also be placed such that the positional relationship of the interconnections in the schematic is maintained in the layout.

Also provided are methods of automatically generating a custom element layout. In a first method, a number of transistor types are described in a template description file. A schematic specifies which transistor type to place in the design and some of the parameters associated with the transistor. The method retrieves a layout template for the transistor from the template description file and the template is modified according to the parameters specified. A resulting geometry is drawn in a physical layout.

A second method of automatically generating a custom element layout builds geometries based on a description in a geometric device description file. The geometric device description file lists a series of commands for a device builder to create geometries based on values in a technology file and the schematic.

The present invention further provides constraints to be placed on the designer of a schematic to speed up the layout process. If the constraints are violated, a warning is given to the user. Alternatively, any violation of the constraint is removed automatically.

The present invention also provides a method to create symmetrical layout geometries out of asymmetrical ones. Conductive wires are placed to electrically connect terminals of the element to midpoints along an edge of the element.

The present invention also provides a method of determining the number of contact regions that may be placed within a certain geometry and placing the contacts automatically. If there is not enough room for the number of contacts required, the geometry is expanded or additional space appended to allow room for the contacts to be placed.

The methods of the present invention may be implemented in computer software and operated on a layout system. The software may be stored on a storage medium within the layout system or on removable storage devices.

A further understanding of the nature and advantages of the inventions presented herein may be realized by reference to the remaining portions of the specification and the attached claims.

DETAILED DESCRIPTION OF THE SPECIFIC EMBODIMENT

Figure 1A:
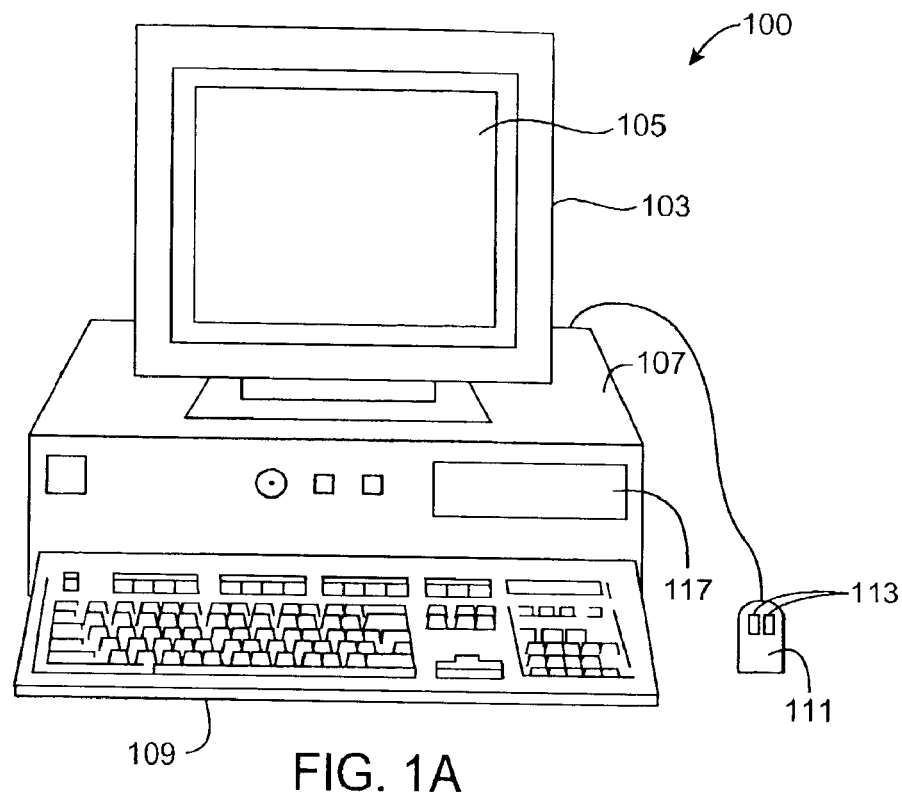
FIG. 1A is a apparatus upon which a software program of the present invention may be operated.

FIG. 1A illustrates an example of a layout system of the present invention. More specifically, FIG. 1A may comprise a computer system used to execute the software of the present invention. FIG. 1A shows a layout system 100 which includes a monitor 103, screen 105, cabinet 107, keyboard 109, and mouse 111. Mouse 111 may have one or more buttons such as mouse buttons 113. Cabinet 107 houses familiar computer components (not shown) such as a processor, memory, mass storage devices 117, and the like. Mass storage devices 117 may include mass disk drives, floppy disks, magnetic disk, fixed disk, hard disk, CD-ROM, CD-WORM, tape storage, and other similar media, and combinations of these. A binary, machine-executable version, of the software of the present invention may be stored or reside on mass storage devices 117. Furthermore, the source code of the software of the present invention may also be stored or reside on mass storage devices 117.

Figure 1B:
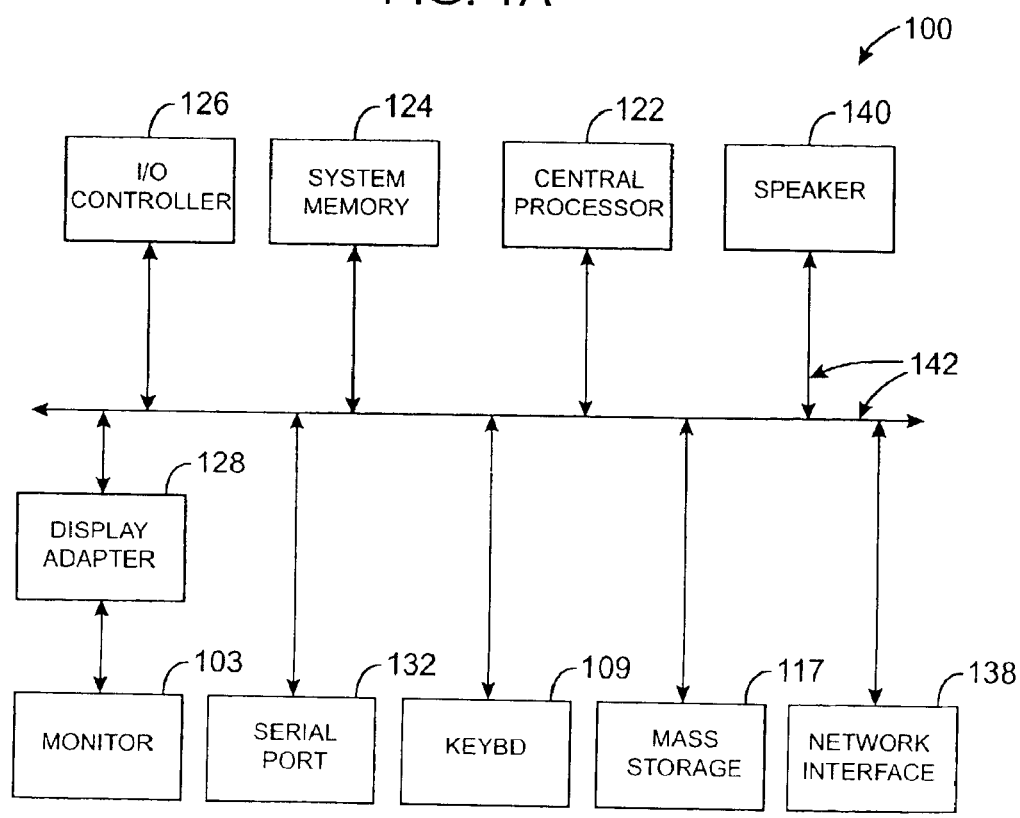
FIG. 1B is a more detailed diagram of an apparatus upon which a software program in the present invention may be operated.

FIG. 1B shows a system block diagram of layout system 100 used to execute the software of the present invention. As in FIG. 1A, layout system 100 includes monitor 103, keyboard 109, and mass storage devices 117. Layout system 100 further includes subsystems such as central processor 122, system memory 124, I/O controller 126, display adaptor 128, serial port 132, network interface 138, and speaker 140. Other computer systems suitable for use with the present invention may include additional or fewer subsystems. For example, another computer system could include more than one processor 122 (i.e., a multiprocessor system) or a system may include a cache memory.

Arrows such as 142 represent the system bus architecture of computer system 100. However, these arrows are illustrative of any interconnection scheme serving to link the subsystems. For example, speaker 140 could be connected to the other subsystems through a port or have an internal direct connection to central processor 122. Computer system 100 shown in FIG. 1B is an example of a computer system suitable for use with the present invention. Other configurations of subsystems suitable for use with the present invention will be readily apparent to one of ordinary skill in the art.

Figure 1C:
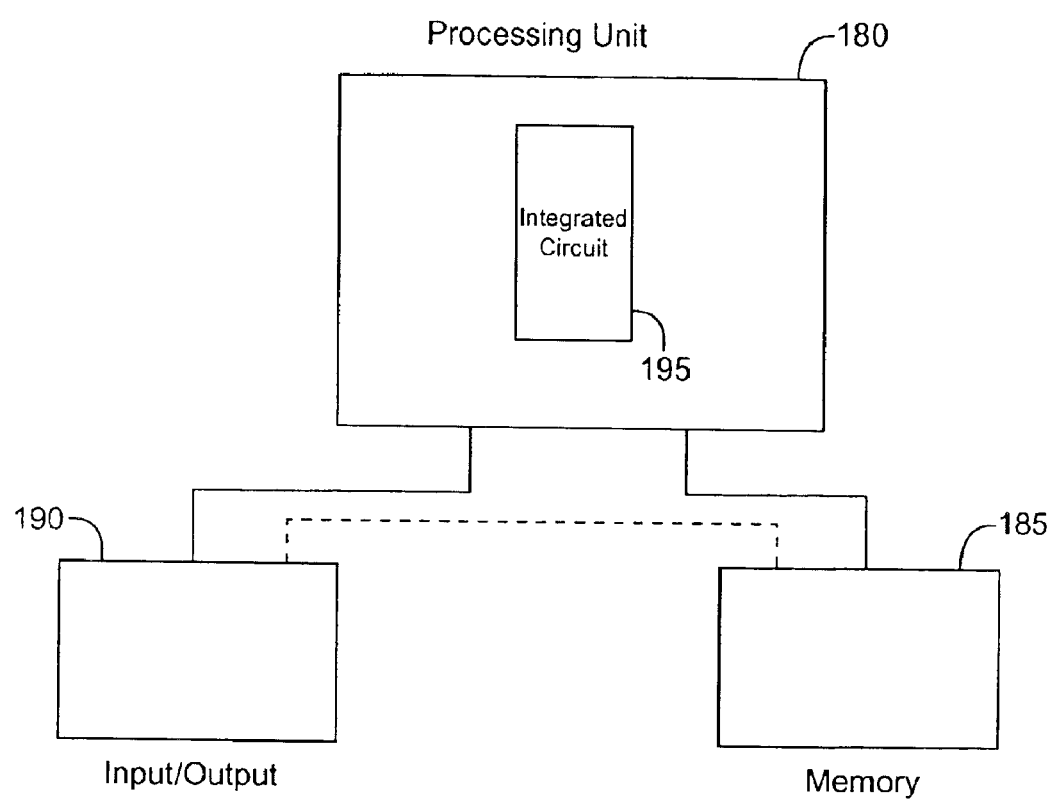
FIG. 1C is a digital system using an integrated circuit of the present invention.

FIG. 1C illustrates a typical environment in which an integrated circuit having been designed using the principles of the present invention may be embodied. A digital system has a processing unit 180 that is coupled with a memory 185 and an input/output device 190. A personal computer is an example of such a digital system. However, a wide variety of electronic and consumer products will find beneficial use from the present invention. The present invention will find application in telecommunications, switches, networks, and many other areas of technology.

The digital system of FIG. 1C contains one or more integrated circuits 195 created by the methods described in the present invention. In FIG. 1C, integrated circuit 195 is shown as a part of processing unit 180. However, memory 185 or input/output device 190 may also contain integrated circuit 195.

The digital system shown may be embodied on a single board, on multiple boards, or even within multiple enclosures. Furthermore, the digital system may comprise any multiple or combination of the devices shown. For example, the digital system may have multiple processing units 180, or have no processing unit 180 at all. One of the advantages of an integrated circuit is its logical flexibility. Consequently, one with skill in the art can readily envision many applications for utilizing such a device within a variety of digital systems.

Figure 2:
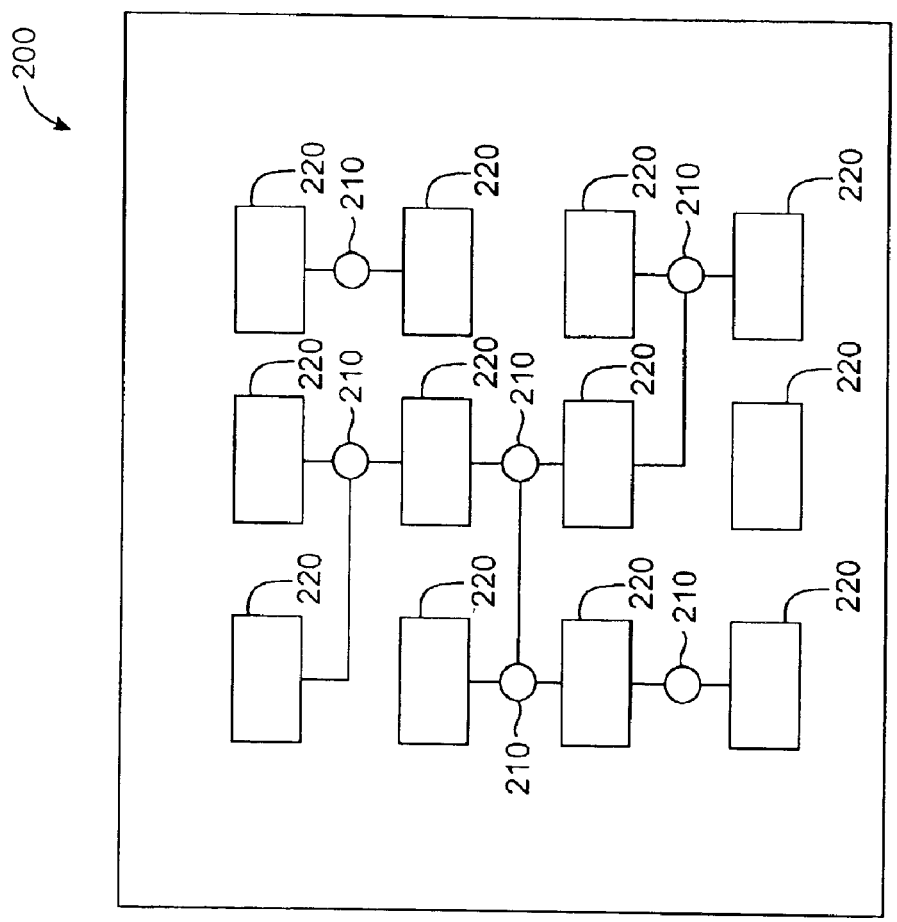
FIG. 2 depicts an example of a partial layout of a test chip.

FIG. 2 depicts an example of a partial layout of a test chip 200. Although the present invention will provide benefits in a wide variety of integrated circuits, test chip 200 is a specific example of a type of integrated circuit that is especially well-suited for using the layout systems of the present invention. Contrary to a typical integrated circuit which generally contains many elements compared with the number of input/output pads, a test chip generally has relatively few elements and many input/output pads.

Test chip 200 has one or more elements 210 and one or more input/output pads 220. Input/output pads 220 are typically arranged in a regular pattern throughout test chip 200. The pattern of input/output pads 220 is designed to match a bed of test probes on a testing apparatus. Element 210 has one or more terminals which may connect to input/output pads 220 or to the terminals of another element 210. Element 220 may be, for example, a transistor, a capacitor, a resistor, a ring oscillator, a memory cell, a sense amplifier, or other active or passive element.

A designer may use such a test chip for a variety of purposes, for example, testing fabrication processes, determining device operating characteristics, and creating simulation models. Often, elements 210 may be placed in several different orientations with respect to the X-Y axis, to determine the effect of the orientation on the characteristics of a particular element. For example, element 210 may be placed vertically or rotated through a 360 degree range. For example, the elements may be rotated 30, 45, 60, 90 degrees, or multiples thereof. Elements are also often included with varying sizes, ratios, or other parameters. For example, the channel length and channel width of transistors are often varied. This allows the designers to determine the effect of different parameters on the operating characteristics of a particular element.

Other types of integrated circuits also have elements and input/output pads such as those described with respect to test chip 200 in FIG. 2. In today's integrated circuits, the number of input/output pads continue to rise, without the same proportional miniaturization of pads compared with transistor or other elements. Therefore, often the size of devices is limited by the pads rather than the function of the logic. The present invention will find application in such integrated circuits as well.

Figure 3:
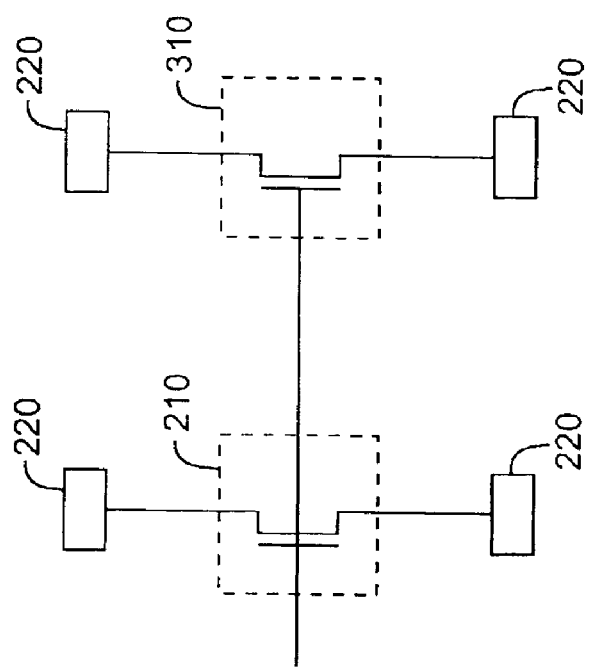
FIG. 3 depicts a schematic representation of a test chip circuit.

FIG. 3 depicts a schematic representation of an example circuit that may be found in an integrated circuit, for example, test chip 200 of FIG. 2. Element 210 is connected between input/output pads 220. Element 210 is a three-terminal element, in this specific example, an nMOS transistor. The source and drains of element 210 are connected to separate input/output pads 220, while the gate is connected to the gate of a second transistor 310. One of skill in the art can readily see that many different elements may be depicted using different symbols. A schematic representation of a design is a gate, device, and transistor level, symbolic representation of each element and connection in the design.

The schematic design may be generated manually or automatically using commercially available software packages. Many software packages are available for generating such a schematic manually. For example, Orcad, Viewlogic, and p-Spice software packages are available. Alternatively, the design may be entered in one of many hardware description languages such as VHDL and translated by software into a schematic. For example, Synopsis provides such a package. Generally, the schematic is described in a schematic file and stored on magnetic media.

Figure 4:
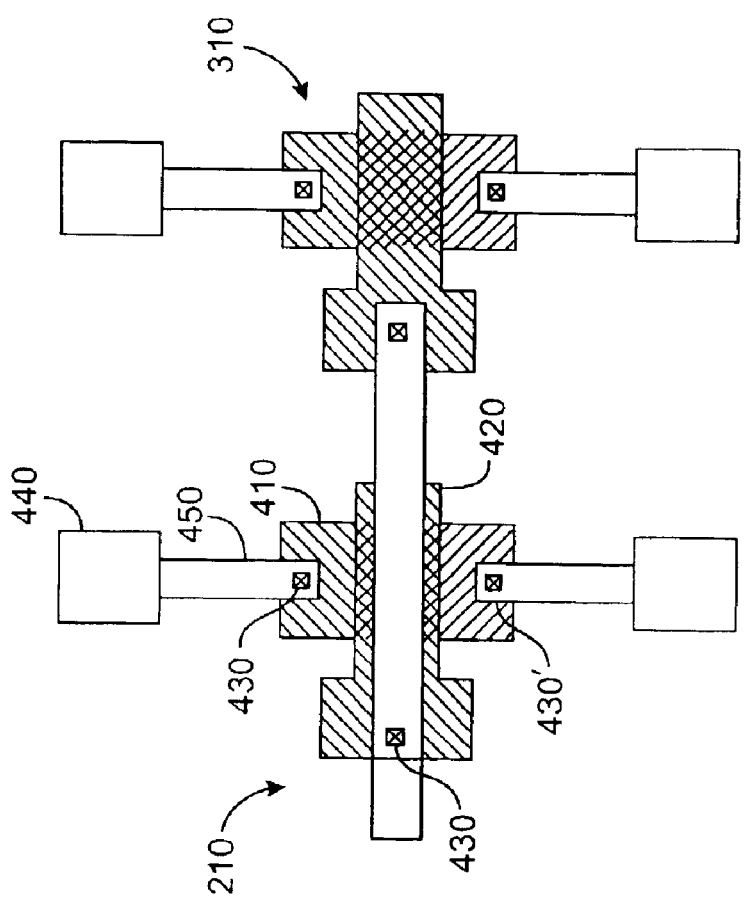
FIG. 4 depicts a physical layout of the circuit in FIG. 3.

FIG. 4 depicts a physical layout representation of the schematic of FIG. 3. An integrated circuit is typically fabricated on several layers of different materials on a substrate material. These layers include oxide layers, polysilicon layers, diffusion layers, and metal layers, to name a few. Often a semiconductor will have multiple instances of each of these layers. For example, there may be three or more layers of metal. Elements and interconnections are formed by different geometric patterns placed in the different layers. A physical layout is a representation that has various geometries representing different geometric patterns on the various levels. Generally, the geometries are made up of one or more polygons.

For example, element 210 from the schematic of FIG. 3 is represented in the physical layout of FIG. 4 by several polygons. A region of diffusion 410 in one layer is overlapped by a region of polysilicon 420 in another layer. The area where diffusion 410 and polysilicon 420 overlap creates a channel region 422 between a source region 424 and a drain region 426. The operation of element 210 is controlled by a gate region 428. A contact 430 is placed on each of the source, drain, and gate regions 424, 426, and 428. Contact 430 is an interconnective element that electrically connects geometries that are on different layers of the layout. An input/output pad 440 is provided to correspond to input/output pad 220 of the schematic. An area of metal 450 is placed in another layer of the layout and connected with contact 430 on the source and input/output pad 410. Similar metal lines make connections to drain 426 and the gate 428 through contacts 430.

According to one aspect of the present invention, a software package for creating a physical layout such as that shown in FIG. 4 is provided. In a specific embodiment, a file is created that contains a set of commands to describe the layout. The commands are such that a layout editor may create the element automatically by executing the commands of the layout editor. In the past, it has been known to use a layout editor to create polygons. The polygons correspond to regions on the various levels which form the various elements as described above. Typically, the polygons were drawn by a layout designer using a layout editor.

Some layout editors allow for some commands to be entered from a command line, or to be read in from a file. In some layout editors, this file is known as an LTL file. (This name is derived from the ".ltl" extension that is placed in the file name.) In the past, this file has been used to do simple tasks such as setting up the editor to the designers preferences, and to enter commands from the command line rather than to draw the figure manually. In the specific embodiment of the present invention, an LTL file is created using commands that describes the entire layout. The layout editor is then able to create the layout automatically by executing the commands in the LTL file. This is a vast improvement over the manual entry of the past.

An example of an LTL command is the "build_rect" command. This is a command to the layout editor to build a rectangle. The syntax of the command is as follows:

build_rect<$X_0,Y_0$><$X_1,Y_1$><layer> where ($X_0$, $Y_0$) is a lower left corner of the rectangle, ($X_1$, $Y_1$) is the coordinate the upper right corner of the rectangle and layer is the layer of the layout where the rectangle is located.

The present invention generates layouts in an improved way compared to is currently available software packages. The circuits may be divided into individual elements (sometimes referred to as resources). The resources may be placed and the connections between the resources made. Sophisticated algorithms may be used to determine the placement of the elements and the routing of the interconnections. The current invention takes advantage of the designers ability—and sometimes necessity—to place and route the items in the schematic.

The specific embodiment of the present invention translates the elements and interconnects in the schematic to various geometries in a physical layout such that the elements have substantially the same positional relationship in the layout as in the schematic. Positional relationship refers to the relative position of the elements with respect to each other (i.e., above, below, left, or right.) In other words, the geometries and their position in the physical layout is provided at a one-to-one correspondence with the elements and interconnects in the schematic. This is shown graphically in FIGS. 3 and 4.

The geometries corresponding to the elements of the schematic may be created in different ways as will be described subsequently. They are placed in the layout, maintaining their positional relationship. In the specific embodiment, the schematic has a coordinate system and the geometries are placed in the layout according to the coordinates that the elements are located on the schematic. Geometries are then placed in the layout corresponding to the interconnect lines of the schematic. For example, these may be rectangles in the metal one layer, or other conductive layers. In the specific embodiment, an attempt is made to keep the same positional relationship between the interconnects in the schematic and the corresponding geometries in the layout. Therefore, the geometries are initially placed according to the coordinates of the interconnects in the schematic. Alternatively, the geometries corresponding to the interconnections may be made such that the electrical connection is made, but the positional relationship is not necessarily maintained.

An advantage to this approach is that the physical layout of the elements and wiring can be determined by the designer of the schematic. As mentioned above, in some cases, a human being is much more efficient in routing wires than currently available software packages. Also, sometimes a designer will intend to design a specific layout and does not want the physical layout generator, whether it be automatic or manual to change it. For example, test chips are designed to have a specific layout by the designer. Typically, a schematic is generated by the designer, and the layout is created manually from the schematic. Time can be saved in generating the physical layout using the automatic process of the present invention.

According to the present invention, constraints may be placed on how the designer implements the schematic. While the software will still operate without adhering to them, these constraints will generally speed up the layout process greatly. By following the constraints, the layout will more likely be built in a one-to-one relationship with the schematic. In a specific embodiment, if any of the constraints are violated, the user may be given a message or other signal that there is a constraint violation in the schematic. Alternatively, the software may take steps to remedy the violation in the layout.

Figure 5A:
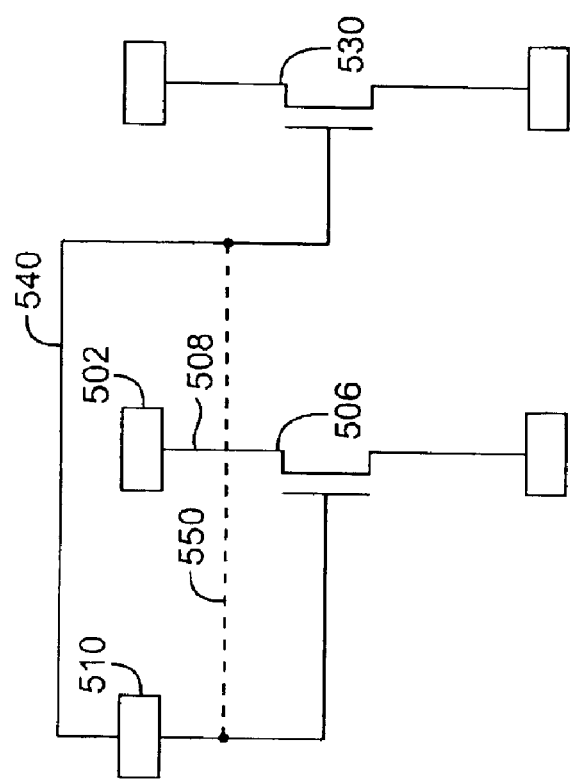
FIGS. 5A, 5B, and 5C are diagrams showing the constraints placed on schematic editors for optimizing the advantages of the present invention.

A first constraint is that the designer should avoid unwanted intersections of conductive wires. This is depicted in FIG. 5A. A first input element 502 is connected to the source of a first transistor 506 by a first interconnect segment 508. A second input element 510 is coupled to the gate of a second transistor 530 by a second interconnect segment 540. As can be seen, second interconnect segment 540 does not cross first interconnect segment 510 (or any other conductive wires,) as suggested in the first constraint. A more natural way for the designer to draw interconnect segment 540 may be along the path shown by dashed line 550. However, this would violate the first constraint, since that would cross first interconnect segment 508.

If a connection such as shown by dashed line 550 is made, the connection may be rerouted by software to solve the problem. For example a jumper may be placed on one of the crossed interconnect segments to avoid the other. Alternatively, a new path such as that shown by second interconnect segment 540 may be found by the software. However, if the constraint is violated in this manner, the software will have to do more work that may be time consuming. In essence, by adhering to the constraint, the designer is choosing a path that will enable the software to place the wire directly, without running complex routing routines.

Figure 5B:
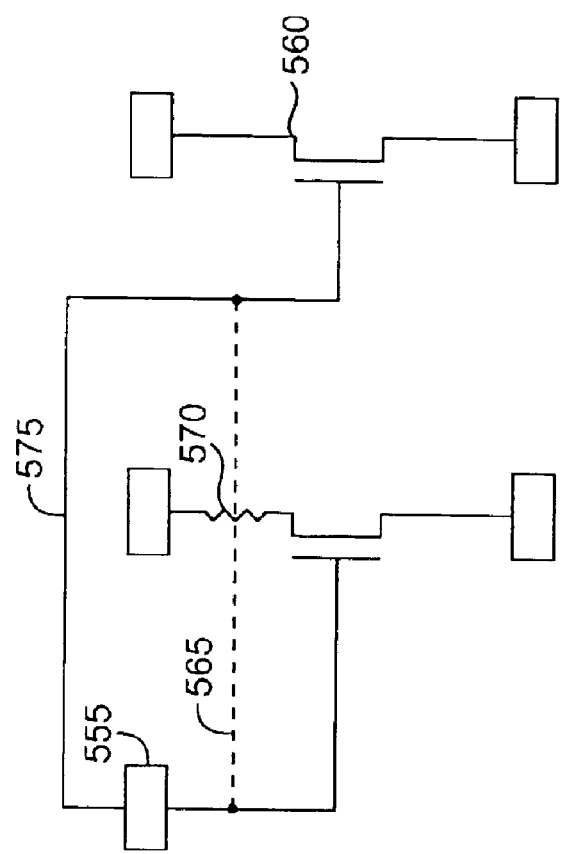

A second constraint is to avoid crossing elements with conductive wires. Because the same layer may be used in the physical layout to create elements and to create the wires, care must be taken to avoid unwanted shorts between the wires and elements. By avoiding putting wires across elements, the software does not have to find alternative routing for the wires. FIG. 5B depicts this constraint. The natural way of drawing a connection between an input element 555 and a gate of a transistor 560 may be in a direct path as shown by dashed line 565. However, this wire would cross a resistor 570, in violation of the second constraint. Instead, the designer may draw the connection as shown by interconnect segment 575. This allows the software to directly place the wire without having to find alternative routing. However, if the constraint is violated, the software may find an alternative route for interconnect segment 575. This constraint is also required in most commercially available software packages.

A third constraint is to keep a reasonable relationship between the size of the elements of the schematic and the physical size of the element that will be placed in the physical layout. The physical layout requires a fixed amount of space for each element. Although many items can be shown on the schematic in a small area, if these will not fit in the same portion of the physical layout as depicted in the schematic, then the software must do extra work to create space on the physical layout for the elements. This is especially a concern when hierarchical boxes are shown in the schematic to show several elements together.

In a schematic representation, hierarchical boxes are often used to simplify the schematic. However, the designer should take care that the size of the box used to represent the elements have a rational relationship to the area it will take to place the elements on the layout.

Figure 5C:
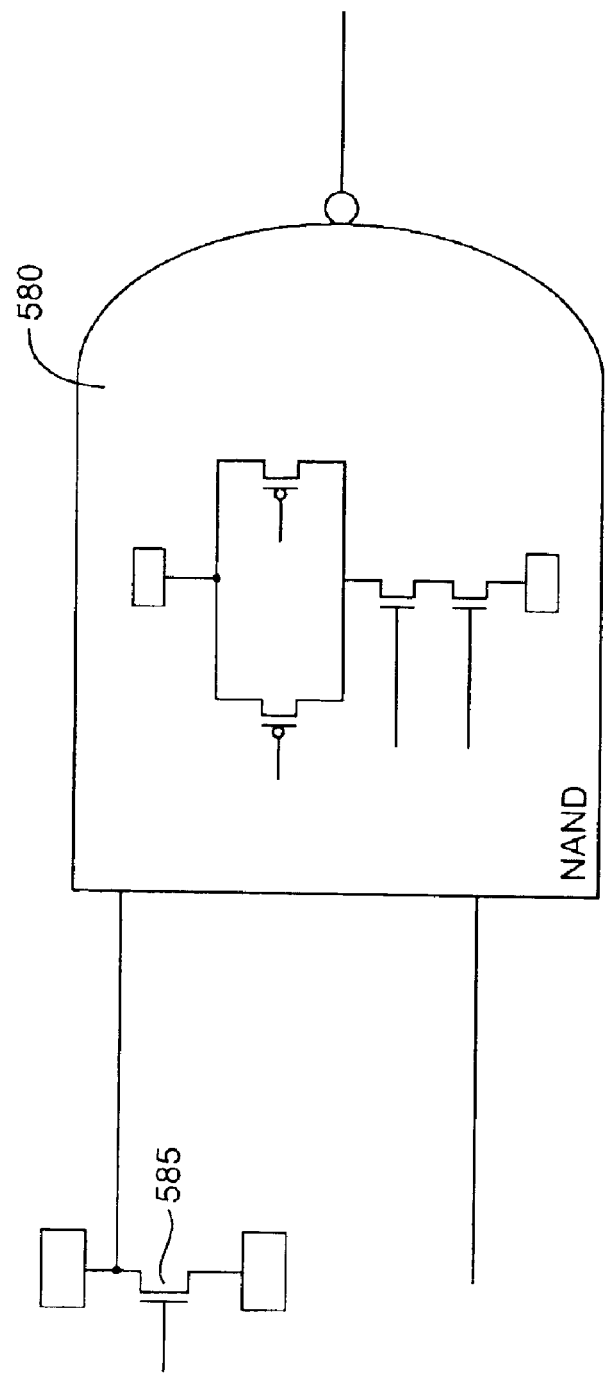

FIG. 5C depicts the use of this constraint. A NAND gate 580 is connected to the output of a transistor 585. As will be recognized by one of skill in the art, a NAND gate may require several transistors to implement the function. These transistors are often not shown individually in the schematic, but nonetheless must be included in the design at the physical layout level. NAND gate 585 is depicted in FIG. 5C as being large enough to hold several transistors of the size of transistor 585. The designer's natural tendency may be to make the symbol for NAND gate 585 small enough to fit in the drawing aesthetically.

In an embodiment of the present invention, the schematic is translated from a schematic design to a layout design as described above. One or more elements may be represented by a single hierarchical symbols. The hierarchical symbols are translated to layout geometries and placed in the layout in the location of the layout corresponding to the position of the symbol in the schematic. If the layout geometries overlap each other, than the constraint has been violated. The software may then expand the layout design to provide room for the geometries or provide a warning to the user that a constraint violation has occurred.

For test chips, this constraint is not generally a concern for designer. Normally test chips do not have high levels of hierarchy because specific elements are being tested individually. However, in other types of integrated circuits, hierarchical levels are widely used in the schematics.

In general, the above constraints do not slow the schematic process down significantly compared with the amount of time saved in the layout process. Also, once the schematic has been drawn, minor changes may be made to the schematic without having major changes to the layout. In the case of presently available software, the program creates a new placement and routing each time any change is made to the schematic. Therefore, in a dynamic design, the time savings become greater with each iteration. Furthermore, since the routing changed each time it was run, the timing characteristics and other aspects of the design changed with each iteration and new simulations had to be performed.

In some applications, implementing these constraints may lead to a less compact design. However, quite often speed of the design process is more important than the size of the area taken up by a particular design layout. Time to market, efficient use of designer resources, and other issues often make it more important to design quickly rather than compactly. This is often true for test chips, consumer products, and integrated circuits with high numbers of I/O's compared with the amount of circuitry in the integrated circuit. These types of integrated circuits are generally not space constrained and may benefit from the present invention. The present invention is also well suited for designs in which speed to market is more important than sizing constraints. However, these above-mentioned types are given by way of example only, and are not intended to limit the applications of the present invention.

In some situations, the designer may actually do a better job designing the layout according to these constraints than presently available software can do without the constraints. Commercial software that is currently available cannot solve "The Traveling Salesman" problem presented by the current breed of integrated circuits. So, an optimal solution is not generally found by automated software. Often a designer will be able to cut down on the space used by carefully placing elements and interconnections.

Figure 6A:
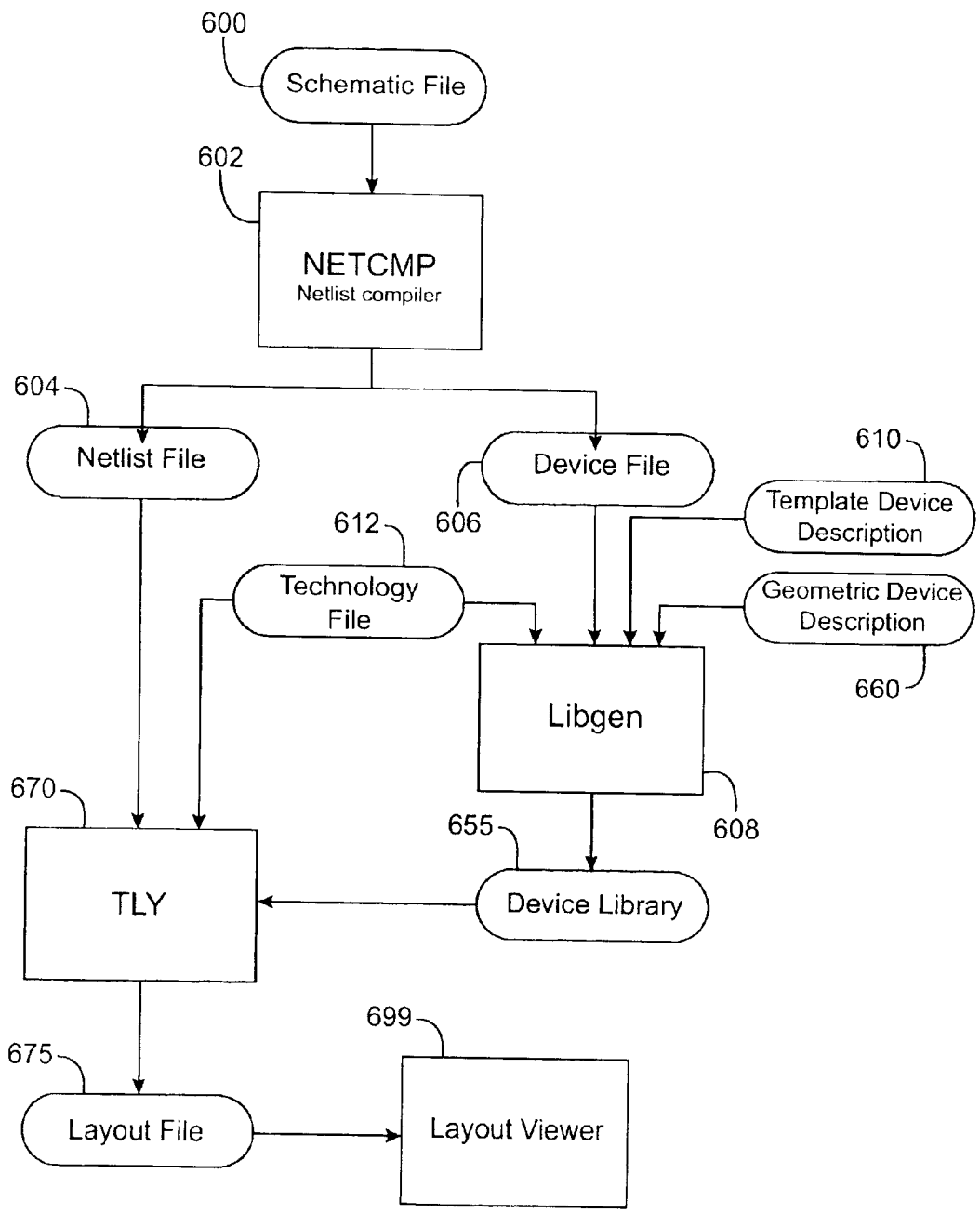
FIG. 6A is a high level flow chart of a method of the present invention.

FIG. 6A is a high-level flow chart of a layout design software package to create a physical layout from a schematic file. In a specific embodiment of the present invention, the layout design software is written in C++ and is object-oriented. An example of source code is provided on microfiche in Appendix A. Of course, the software could be written any of a number of programming languages. The software may run on a layout system 100 such as that described in FIGS. 1A and 1B above. It may be stored on, for example, a magnetic medium such as tape, disk, or diskette. In the layout system of FIGS. 1A and 1B, the software may reside for example, in mass storage 117 or in system memory 124.

Referring to FIG. 6A, each oval (e.g., ovals 600, 604, 606, 610, 612, 660, and 675) represents a particular file upon which the software may perform operations. The rectangular boxes (e.g., boxes 602, 608, 670, and 690) each represent one or more components of the software that perform various operations upon the files that are input to it.

The input to the layout design software may be a schematic file 600. Schematic file 600 may be generated, for example, by a schematic editor, HDL synthesizer, or by other means. Schematic file 600 is a representation of a schematic design such as the one shown in FIG. 3. Typically, this file contains information about the elements in the schematic, the connections between the elements, the physical characteristics of the elements (i.e., transistor W/L characteristics), the orientation of the elements, and the location of the elements in the schematic.

In step 602, a netlist compiler processes schematic file 600 to create a netlist file 604 and a device file 606. Netlist file 604 contains a list of the various elements in the schematic file, their location, and the interconnections between the elements. In the specific embodiment, this is a binary file. However, other types of files, such as ASCII or EBCDIC, may also be used without departing from the spirit of the invention. The netlist compiler extracts the information that is of interest from schematic file 600 and places it in netlist file 604. It may eliminate unneeded information from netlist file 604 such as comments and the like. It also organizes the information in a logical fashion that is easily used by the subsequent program components.

Device file 606 is also created by the netlist compiler in step 602. It holds information about the elements that are used in the design. It may be, for example, an ASCII file that has a list of the elements that will be used in the design. Other information may be included in device file 606. Typically this file is much smaller than the schematic file.

Schematic file 600 may not be a standard format. Each schematic file generation program may create a different format for its output file. Therefore, another purpose of the netlist compiler is to format the information in the schematic file into a common format in netlist file 604 and device file 606. By changing only the netlist compiler used in step 602, different formats can be accommodated without changing the entire program.

The next process is a library generation (libgen) process shown as step 608. In step 608, one or more procedures operate on device file 606 to create a device library 665. These procedures create a detailed layout description in device library 665 for each element in device file 606. In the specific embodiment, step 608 generates a command file that is readable by a layout editor. This may be an LTL file as described above.

Step 608 may create detailed layout descriptions for device library 665 in two different ways. A first method, referred to as a device generator 630, is generally used for simple elements. A template device description file 610, (also referred to herein as a cell database 610) is provided that has pre-designed layouts for some elements. In the specific embodiment, template device description file 610 describes each element with LTL data. Step 608 retrieves the element from the file and puts it in device library 665.

Figure 6B:
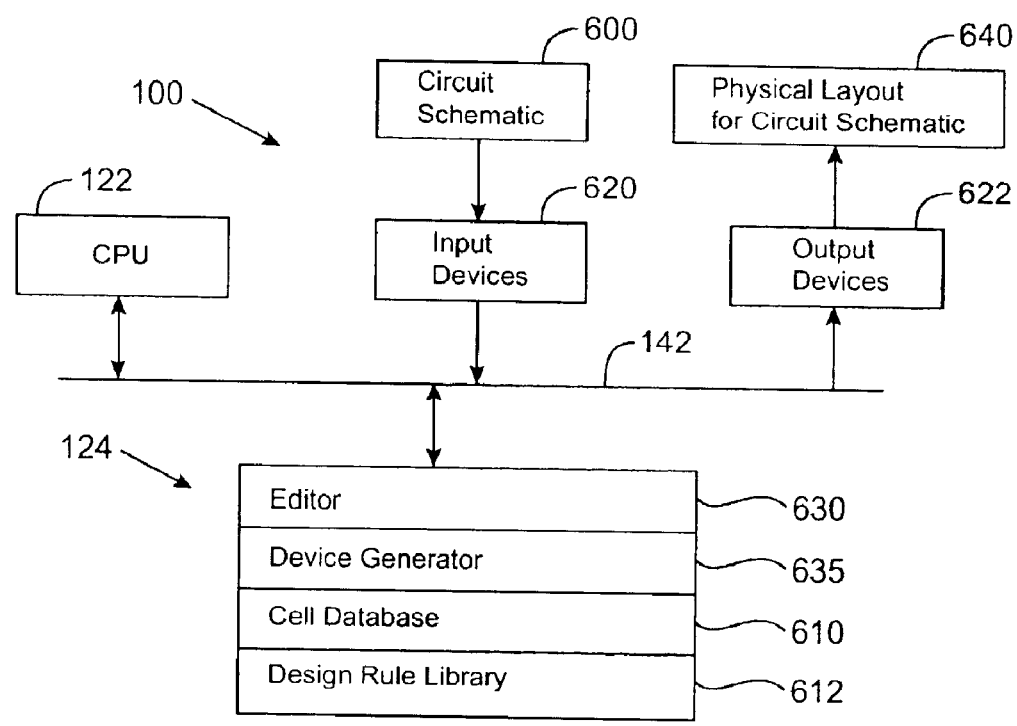
FIG. 6B illustrates an apparatus constructed in accordance with an embodiment of the invention.

FIG. 6B illustrates a layout system 100 in accordance with this aspect of the invention. Layout system 100 may be, for example a computer system such as that shown in FIGS. 1A and 1B. The apparatus 100 includes a central processing unit (CPU) 122 that communicates with a set of input devices 620 and output devices 622 over a system bus 142. The CPU 122 also communicates with a memory 124 over the system bus 142. The interaction of a CPU 122, input devices 620, output devices 622, and a memory 124 is known in the art. The present invention is directed toward the execution of a set of programs stored in memory 124. The programs include an editor 630, which interacts with the input devices 620 to characterize a custom transistor. The device generator 635 receives the transistor information from the editor 630 and generates a custom physical layout for the transistor. In this context, editor 630 is synonymous with a combination of schematic 600 and netlist compiler 602, which produce device file 606. The device generator 635 relies upon a cell library 610 to match the specified transistor with a library cell. In addition, the device generator 635 relies upon a design rule library 612 to insure that the transistor is drawn in accordance with technology design requirements. Design rule library 612 is also referred to herein as technology file 612.

The executable programs (610, 612, 630, and 635) of the invention allow a circuit schematic 600 received at the input devices 620 to be transformed into a physical layout 640, as generated by the output devices 622. The input devices 620 may include a keyboard 109, mouse 111, scanner, etc. The output devices 622 may include a computer monitor 103, printer, plotter, etc.

Figure 6C:
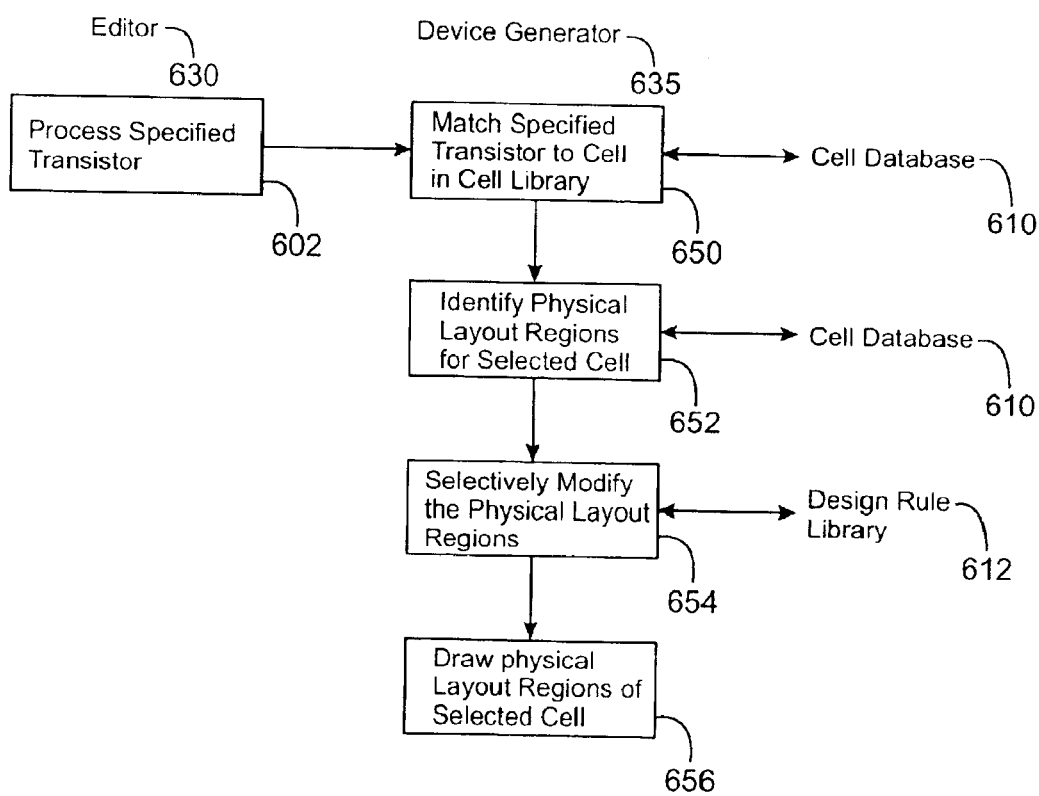
FIG. 6C illustrates processing steps associated with an embodiment of the invention.

The processing of the invention is more fully appreciated with reference to FIG. 6C. FIG. 6C illustrates processing steps in blocks. The executable programs in memory that are used to perform the processing steps are also shown in FIG. 6C. For example, FIG. 6C illustrates that the editor 630 is used to process a specified transistor. Preferably, the following command syntax is used in the editor:

devgen<device_type><width>[/length][M=no_of_legs]
[INST=<instance_name>]
{S=<source_name>G=<gate_name>D=<drain_name>}
{RA=<resistor_terminal_a>RB=<resistor_terminal_b>}
[(x-coord y-coord)].

The term "devgen" invokes the device generator 635. The term "device_type" specifies the type of transistor to be drawn. The "width" argument is the width of the device, while the "length" argument is the length of the device. If the length is omitted, the device generator 635 will assign a default value.

The "M" argument is the multiplier, or the number of polysilicon legs in the device. The device generator 635 uses a default value of 1 if this argument is not specified. The "INST" argument, "S" argument, "G" argument, and "D" argument are used to specify text to be associated with the drawn device. The "INST" argument is used to specify the instance of the transistor, the "S", "G", an "D" arguments, are respectively used to specify the source, gate and drain of the transistor.

Arguments are also provided for resistors. In particular, the arguments "RA" and "RB" are used to specify the nets connected to the resistor terminals. These values are used in the place of the "S", "G", and "D" arguments.

The "X" and "Y" arguments are used to specify where the device should be drawn in an (x,y) coordinate grid. The use of selected arguments will be illustrated below in relation to an example.

Returning to FIG. 6C, the next processing step is to match the specified transistor to a cell, in the cell library (step 650). This operation is performed by the device generator 635 in conjunction with the cell database 610. The cell database 610 includes a large number of custom transistors including low and medium voltage transistors, high voltage transistors, looped gate transistors, and other special devices. Each transistor may be implemented in a variety of technologies, for instance 0.5 micron triple metal layer CMOS technology or 0.1 micron double metal layer CMOS technology. Based upon the technology used, different design rules will be applicable to the construction of the transistor. In particular, the different physical layout regions of the transistor must satisfy the design rules for the given technology. Thus, as shown in FIG. 6C, the next processing step is to identify physical layout regions for the selected cell (step 652). This operation is also performed in conjunction with the cell database 610.

The next processing step associated with the invention is to selectively modify the physical layout regions based upon the design that is being specified (step 654). As shown in FIG. 6C, this operation is performed in cooperation with the design rule library 612. By way of example, the design rule library 612 includes design rules specifying the minimum polysilicon width, the minimum polysilicon to polysilicon spacing, the minimum polysilicon to diffusion spacing, the minimum polysilicon overlap beyond a diffusion, etc. These parameters change depending upon the device technology that is being implemented. Thus, the design rule library 612 includes rules for different technologies.

After the design rule library 612 is invoked, the physical layout regions for the selected cell may be drawn (step 656). As indicated above, the device generator 635 directs an output device 622, such as a printer, computer monitor, plotter to generate a physical layout for the specified circuit. In a specific embodiment, the physical layout regions are described with an LTL file.

Figure 6D:
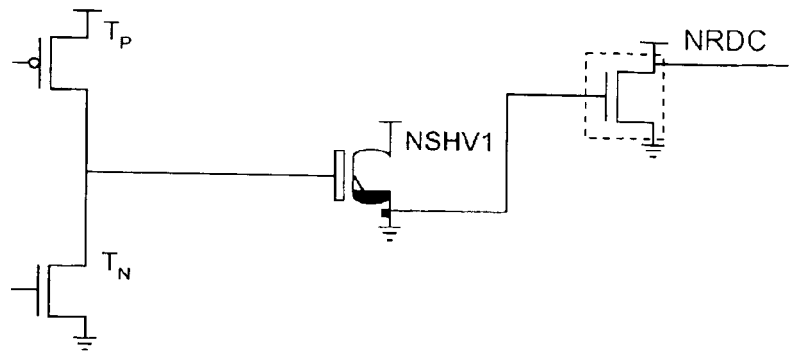
FIG. 6D illustrates a simple circuit schematic that may be processed in accordance with an embodiment of the invention.
Figure 6E:
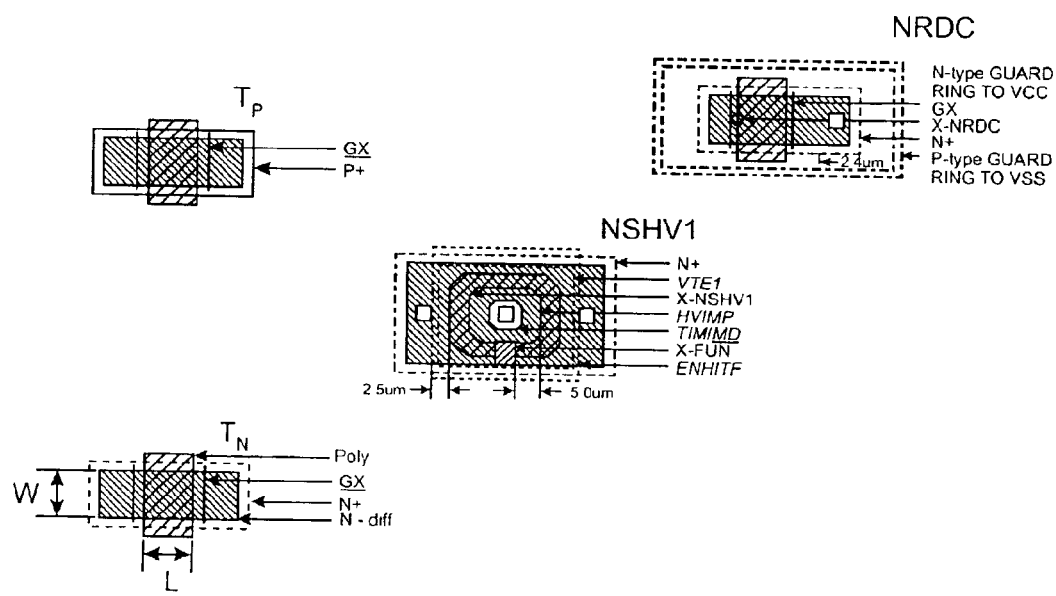
FIG. 6E illustrates a custom physical transistor layout, corresponding to the circuit schematic of FIG. 6D, constricted in accordance with the invention.

The foregoing operations are more fully appreciated with reference to a specific example. FIG. 6D illustrates a schematic that may be processed in accordance with the invention. Typically, a schematic, such as the one shown in FIG. 6D, is provided to a layout engineer, who manually generates a corresponding physical layout. However, in accordance with the invention, the layout can be generated using the previously described software modules. For example, to construct the Tn transistor with a width (W) equal to 5.2 micro-meters, a length (L) equal to 1.1 micro-meters, a multiplier equal to 1, at the physical grid location (1,1), the following command would be used: devgen TN 5.2/1.1 m=1 (1,1). This command entered at the editor 630 invokes the device generator 635. The device generator 635 then performs processing steps 650–656 shown in FIG. 6C. The resultant physical layout is shown in FIG. 6E. The device Tn layout in FIG. 6E illustrates the width (W), length (L), polysilicon physical layout region, N+ physical layout region, N-diffusion physical layout region and the GX metal layer.

A similar command is used to construct the device Tp. For example, the following command may be used: devgen TN 5.2/1.1 m=1 (1,5). This command is consistent with the previous command, but it specifies a different device and a different grid location. The resultant device is shown in FIG. 6E.

The schematic of FIG. 6D includes a complicated looped gate transistor NSHVI. To construct this transistor, the following command is used: devgen NSHVI 8.2/1.3 m=1 (3,3). The resultant device is shown in FIG. 6E. The layout of FIG. 6E indicates that a 5 micrometer contact to gate spacing on the source is required and a 2.5 micro-meter contact to gate spacing on the drain is required. This information is provided by the design rule library 612. FIG. 6E also shows metal layers VTEI, HVIMP, TIM/MD, and ENHITF. FIG. 6E also shows the physical layout region N+, the device name NSHVI, and a label XFUN.

The final element in FIG. 6D is the transistor NRDC, which is relatively complicated device to draw manually. In accordance with the invention, the device is constructed with the following command: devgen NRDC, 7/1 m=1(5,5). The resultant device is shown in FIG. 6E. Note that the contact must be 2.4 micrometers from the gate. This type of feature is very difficult to create manually. The figure shows an N-type guard ring to Vcc, a P-type guard ring to Vss, a metal layer GX, a label X—NRDC, and a physical layout region N+.

Thus, the invention provides an automated approach to generating custom transistor layouts. The invention reduces design time. Preferably, the cell library includes a large variety of transistors, such as low and medium voltage transistors, high voltage transistors, looped gate transistors, and other special devices. Thus, the invention is distinct from layout devices that are limited to generating standard transistor cells. In accordance with the invention, the specified transistor may be assigned an arbitrary size, consequently the cell library is not limited by device size.

A second method of adding elements to device library 665 is through a device builder. A description of each element is included in a geometric device description file 660. Geometric device description file 660 details a series of steps that the device builder executes to create the element. The steps include references to information that is held in technology file 612 and information about the element parameters that is contained in device file 606. The device builder executes these steps and creates a physical layout of an element and places it in device library 665.

A way of doing this is to define an origin point of the element in the schematic. The origin point may be, for example, the lower left corner of the element. The point in the layout that corresponds to the origin is then selected as a starting point for creating the geometries. Two reference lines that are perpendicular to each other and pass through the origin point are used as a starting reference. Typically, all shapes may be derived from these reference lines and from information in device file 606 or technology file 612.

The device builder defines a first polygon that has an edge that lies along a first reference line. From this point, the position of an edge of a second polygon may be derived using a spacing rule found in technology file 612. For example, the spacing rule may be the minimum distance that the polysilicon gate region overhangs the diffusion region in a transistor. The intersection of the reference line and the edge of the second polygon may be the lower left corner of the second polygon. Using other spacing rules and device parameters in design file 606, the upper right corner may be defined.

An advantage of this method over the template method is that it is more flexible. Geometric device description file 660 need only be created once, and may be used thereafter for different technologies and for elements with different parameters. The geometric device descriptions may be time consuming to create, but this is a one-time investment of time.

Figure 6F:
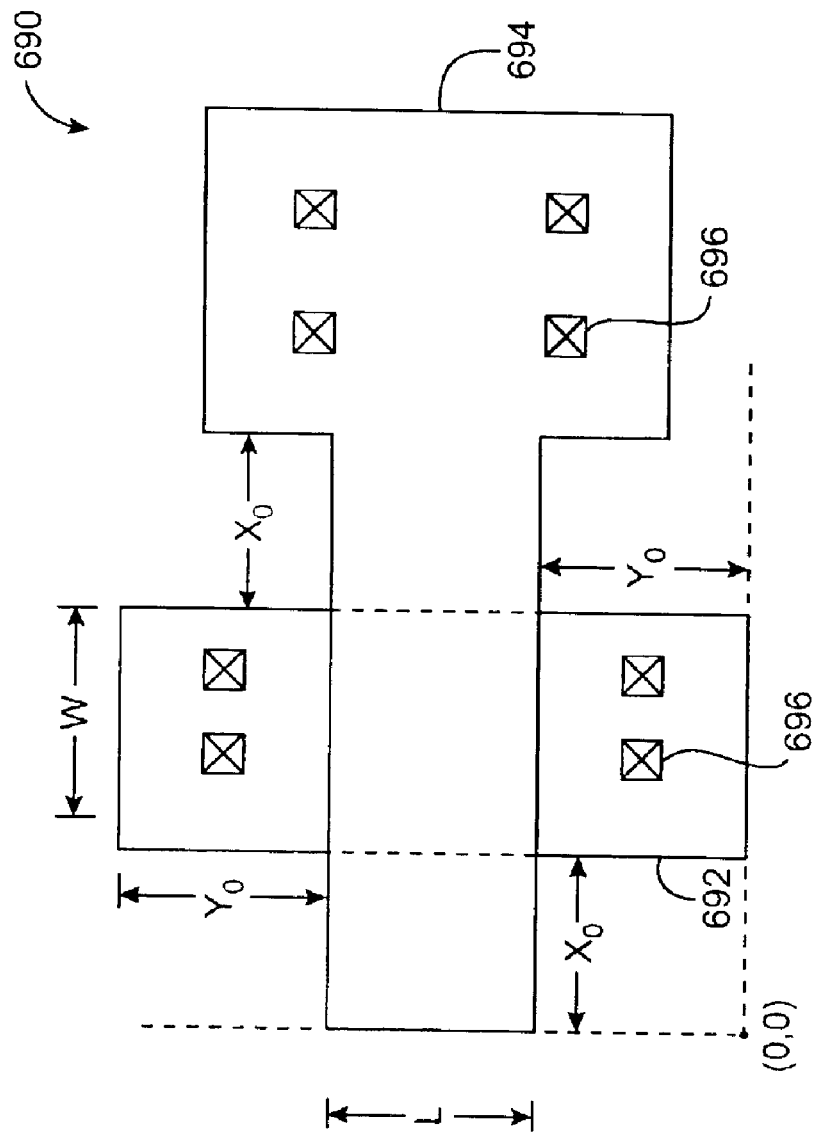
FIG. 6F illustrates a custom physical transistor having been built by the device builder of the present invention.

By way of example, FIG. 6F shows a transistor 690 that may be constructed by the device builder procedure. When step 608 encounters a transistor in device file 606, it may build an element such as transistor 690 of FIG. 6B. Transistor 690 has a diffusion layer 692, a polysilicon layer 694, and one or more contacts 696. In device file 606, the origin, which may be the lower left hand corner of the element is specified. For ease of discussion, this point will be referred to as point (0,0), although it could be any point in the layout.

The device builder may first calculate the position and size of diffusion layer 692. From technology file 612, the device builder obtains the distance of a gate overhang (i.e., the distance the polysilicon extends past the diffusion.) In this specific example, the gate overhang is $X_0$ in FIG. 6F. Adding this distance to the origin, the lower left hand corner of diffusion region 692 is calculated. This will be the point $(X_0,0)$ in the layout.

The width W of diffusion region 692 is a parameter that may be specified in device file 606. Typically, this is an important specification that affects the operating characteristics of the transistor.

The length of diffusion region 692 may be calculated by adding the length of a contact, the distance from the edge of the diffusion to the contact, and the distance from the contact to the polysilicon, (all of which are found in technology file 612.) This calculation gives the value $Y_0$ as shown in FIG. 6B. $Y_0$ is multiplied by two to account for the drain and source sides, and then added to the length of the channel L (which is specified in device file 606.) Knowing this value, and the width of the diffusion W discussed above, the upper right edge of the diffusion area is known to be at coordinate $(X_0+W,2Y_0+L)$.

Furthermore, technology file 612 specifics which layer is diffusion. For example the diffusion layer may be layer 10. The device builder then has enough information to create the LTL command "build_rect $(X_0,0)$ $(X_0+W,2Y_0+L)$ 10" to create diffusion region 692.

In the specific embodiment, the next step is to place contacts 696. The device builder obtains the width of contacts 696, the minimum distance from the edge of diffusion region 692 to contact 696, and the required spacing between contacts 696 from technology file 612. The device builder then calculates how many contacts 696 will fit in the diffusion regions based on these parameters. In the specific embodiment, it places the maximum number that will fit in the diffusion region in an array that is centered within diffusion region 692. Alternatively, the number of contacts may be specified in the schematic.

The device builder may then create polysilicon region 694. The lower left corner is known to start at the left edge of the element at a height of $Y_0$ (i.e., the sum of the size of contact 696, the minimum distance from contact 696 to the edge of diffusion region 692, and the minimum distance from contact 696 to the edge of polysilicon region 694.) The coordinates of the lower left edge is therefore $(0,Y_0)$. The width of polysilicon region 694 is the polysilicon overhang times two plus the channel width W. The length is the same as the channel length L. This gives the upper right corner of polysilicon region 694 as $(2X_0+W,Y_0+L)$. The device builder can use this information along with the polysilicon layer information from technology file 612 to create an appropriate LTL instruction (e.g., build_rect $(0,Y_0)$ $(2X_0+W,Y_0+L)$11, where 11 is the layer of polysilicon for the technology.)

Finally, device builder may add a polysilicon contact area 698 to the polysilicon region 696. In the specific embodiment, this is a fixed size area with a fixed number of contacts 696, for example, four contacts 696. The LTL instruction to create this structure is generated by device builder. Alternatively, the size and shape may be determined by device builder based on a number of contacts specified in the schematic.

This particular example shows a specific example of how to make a transistor. However, one of skill in the art, using the information in this example can envision other elements and methods of creating elements in a similar fashion.

Another advantage of the present invention is the ability to changed to a new technology without creating a new design. By specifying a new technology file, step 608 can operate on the same device file 606 and create a new device library 665 that has geometries designed according to the new technology. This is advantageous in that the same schematic may be used, even though the technology changes.

Another aspect of step 608 is to vary the size of certain areas of geometries to accommodate the design rules as given in technology file 612 and the parameters of a given element as specified in schematic file 600. For example, if schematic file 600 specifies a channel width or length that is so narrow that a contact cannot be placed without breaking a design rule, the area may be enlarged to create sufficient room.

Figure 7A:
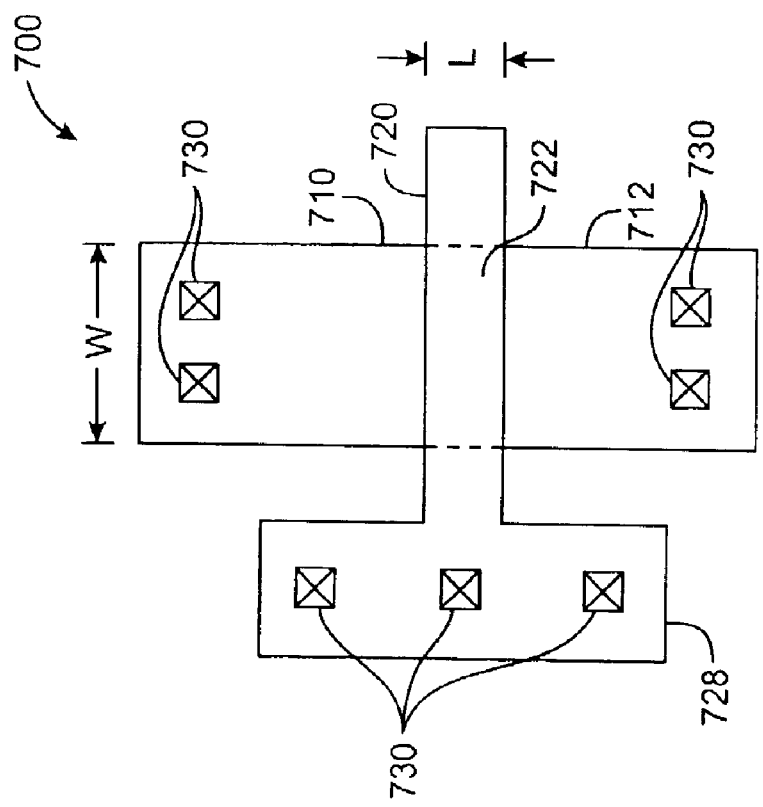
FIG. 7A depicts a representative geometry with expanded contact areas.

An example of this operation is shown in FIG. 7A using a single transistor 700. Transistor 700 comprises a layer of diffusion with a source region 710 and a drain region 712. A layer of polysilicon 720 overlaps the diffusion between source region 710 and drain region 712 to form a channel region 722. The polysilicon outside of channel region 722 is a gate region 728 of the element. Contacts 730 are placed on the source, drain, and gate regions 710, 712, and 728.

The design rules may specify a minimum contact size and a minimum distance that the edge of a contact 730 may be placed from the edge of the polysilicon of gate region 728. Especially in test chips, the channel length L that is specified in schematic file 600 will sometimes not be large enough to have sufficient room for the placing of contact 730 according to the design rules. For example, contact 730 may be specified in the design rules with the minimum contact size that is larger than the length specified in schematic file 600.

In step 608, the process recognizes that a design rule violation will occur if contact 730 is placed, and expands the polygon corresponding to gate region 728 to create room for the number of contacts desired before placing the contacts. For example, in FIG. 7A, three contacts 730 are desired, so the gate region 728 is expanded to allow room for three contacts 730 while maintaining the minimum distance required by the design rules. In the specific embodiment, rather than expanding an existing polygon, an additional polygon is appended adjacent to gate region 728 on the same layer, thereby effectively expanding the region. The software may eventually merge the adjacent regions.

Figure 7B:
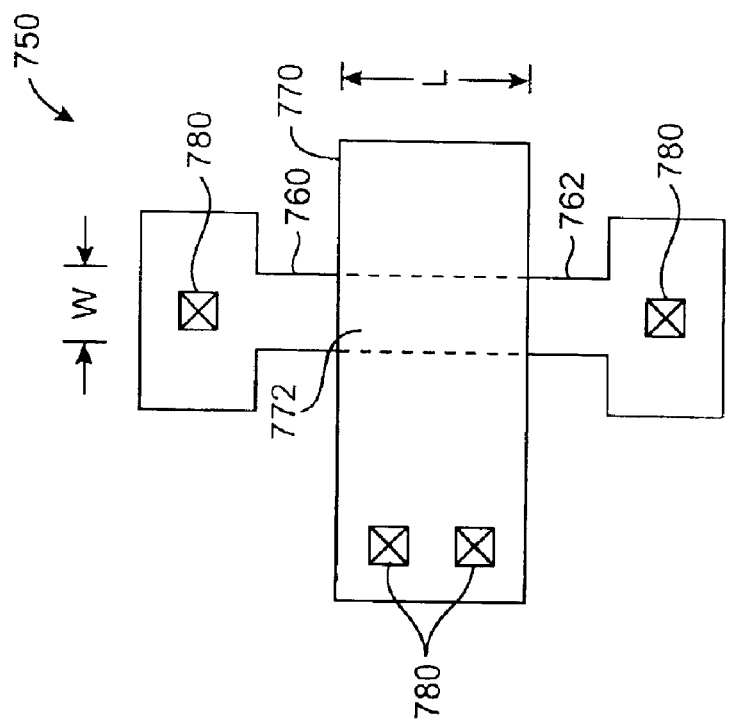
FIG. 7B depicts another representative geometry with expanded contact areas.

In FIG. 7B, a similar concept to that above is shown. In this example, a transistor 750 with a source region 760, a drain region 762, and a gate region 770 has a channel width W that is too small for a contact 780 to be placed on the source region 760 and the drain region 762 according to the design rules. The design rules specify a minimum contact size, and a minimum distance from the edge of the diffusion to the edge of contact 780. Accordingly, step 608 expands the source region 760 and the drain region 762 to allow placement of contact 780.

Figure 8:
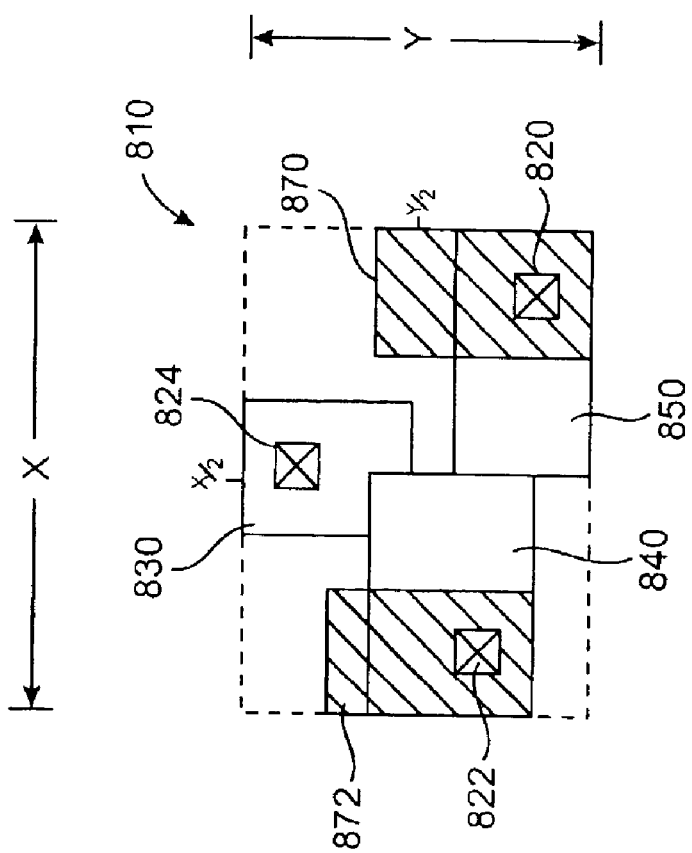
FIG. 8 depicts an irregular geometry that has been revised to be more symmetrical.

Yet another aspect of step 608 of the present invention is represented in FIG. 8. As mentioned above, trading off the area used with the speed of the design process is often desirable. Sometimes an element that is created by the device builder will have irregularities in it such as element 810 shown in FIG. 8. Element 810 is a three terminal element but it does not have symmetry to it. Three contacts 820, 822, and 824 are located in each of three regions 830, 840, and 850. Because of the lack of symmetry in the element, the contacts cannot line up with regularly placed elements. This makes it more difficult to route than a more symmetrical element, especially when being placed in a design with a lot of symmetry.

In the specific embodiment, step 608 creates a symmetrical object out of the nonsymmetrical element 810. An outline of the element is defined. The outline is a box drawn to fully enclose the element. In the specific embodiment, the outline is a minimum sized box that will fully enclose the element. This is shown in FIG. 8 as the dashed line around element 810. The midpoints of the outline of the element are calculated as distance X/2 and distance Y/2. Since contact 820 is not in line with the midpoint, a metal line 870 is placed between the midpoint Y/2 and contact 820 to electrically connect midpoint Y/2 with contact 820. Similarly, a metal line 872 is placed between contact 822 and midpoint Y/2 to electrically connect contact 822 with midpoint Y/2. Since contact 824 is already at midpoint X/2, no metal line is needed to extend it.

At times an element may have two or more contacts on a single edge. In such a case, the contacts may be extended to various points along the edge. In the specific embodiment, these points are situated equidistant from each other and the ends of the particular edge.

After execution of this program, a three-terminal symmetrical element is generated. As can be seen, the terminals on the element of FIG. 8 are much more easily placed in a regular pattern. The use of metal in the example above is by way of example only. Of course, other conductive metals may be used also. Furthermore, depending on the environment in which it will be used, the electrical connections may be extended to midpoint X/2 instead of midpoint Y/2.

Yet another aspect of step 608 places X-layers in the elements. An X-layer is not a physical element, but is a representation in the software of an additional layer in the layout. The purpose of the X-layer is to annotate an element where a design rule has been purposefully violated so that it is not flagged as a design rule violation by a subsequent design rule checking program. Sometimes, especially in test chips, a designer will purposefully violate a design rule. When run through the a design rule checker, these violations will be discovered. The X-layer annotates such design rule violations so that the design rule checker knows to ignore it. It should be noted that an X-layer does not translate to a physical element. It is merely a tool to provide extra information for use by subsequent programs.

If a designer has specifically noted a particular parameter in schematic file 600, the netlist compiler records the parameters in design file 606. In step 608, device file 606 is examined and if such a parameter exists, a polygon is placed in the X-layer in the detailed layout in device library 665. The polygon may completely covers the violation area. When the design rule checker is run, the annotation prevents it from flagging a design rule violation.

For example, if schematic file 600 specifies a particular value for the width W and the length L of a transistor channel that is in violation of a design rule, step 608 makes an polygon in the X-layer of the physical layout that covers the transistor channel. Alternatively, the designer may make a specific symbol on the schematic to indicate that design rule checking is to be activated or deactivated for a particular element.

Referring again to FIG. 6A, the next step is a TLY step 670. A purpose of step 670 is to combine the positioning and connection information of netlist file 604 with the layout information for the elements contained in device library 665. In step 670, the elements are given a geographic placement in the layout design and connections are made between the elements. The result is a layout file 675. Layout file 675 may be an LTL file such as that described above. However, now the file contains additional information about the position of elements and the routing of signals between the elements.

Figure 9:
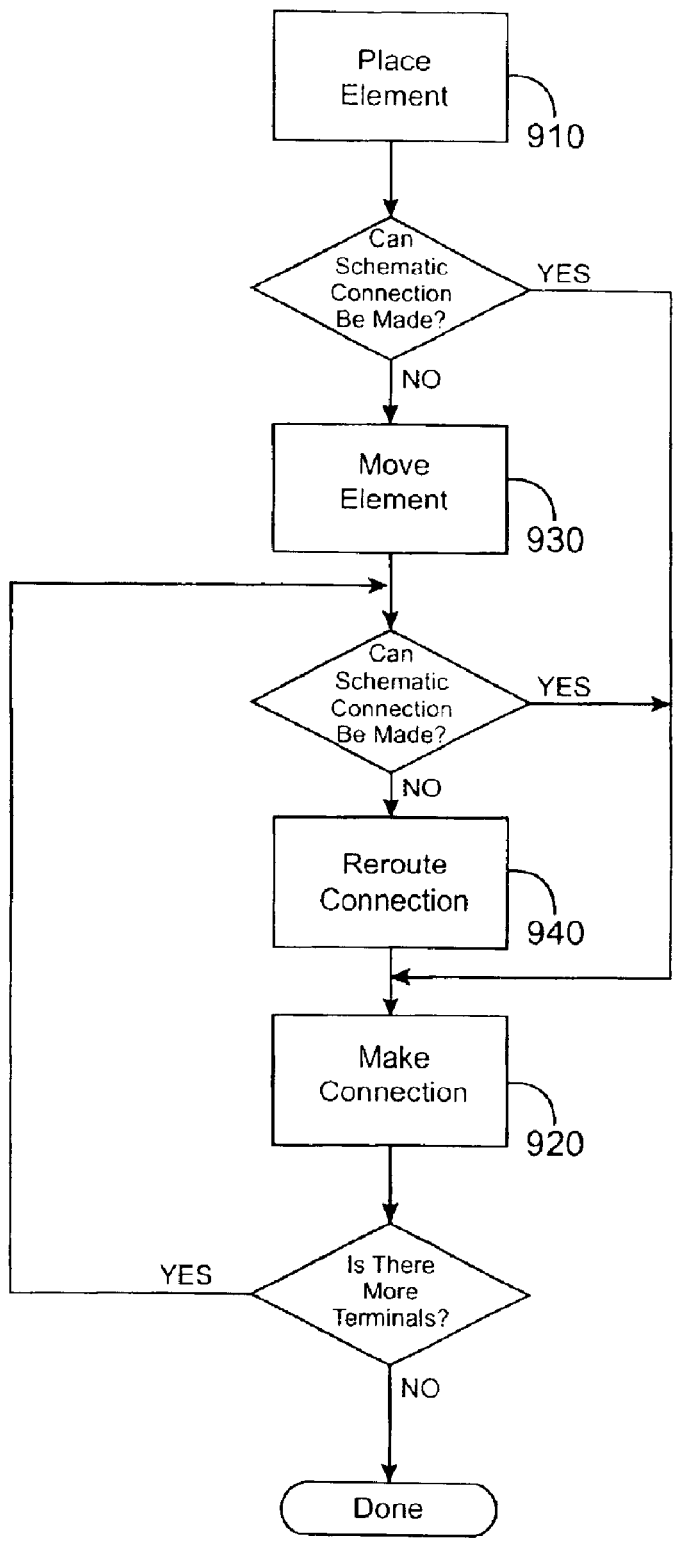
FIG. 9 is a flow chart showing how elements are placed in the physical layout.

Referring to FIG. 9, a flow chart of how step 670 may be accomplished is depicted. Typically, the input/outputs pads are in a fixed location on a test chip. While not a requirement of this invention, the input/output pads are generally in a fixed location to correspond to a bed of test probes for operating the test chip. Elements may be placed between two or more input/output pads, with inputs to the elements coming from the input/output pads or from other elements. Information contained in netlist file 604 indicates the physical position of the element. As shown in FIG. 9, step 670 initially places a geometry in the layout according to the location of the element in the schematic as described in netlist file 604. This is represented as step 910 of the flow chart.

The software then decides in a decision step 920 whether an electrical connection will be made to the geometry of the element by the interconnection geometry. If it can be made, then in step 920 the geometry corresponding to the interconnection is placed. If not, then the element is moved with respect to the input output pads to allow the connection.

After moving the element, it is again examined to see if the connection can be made directly. If it can, then in step 920 the geometry is placed and the connection is made. If not, then the connection must be rerouted in step 940. Rerouting may be done in a variety of ways. For example, if possible, a jumper may be placed to bypass a wire that is crossed by an interconnect geometry but no connection is desired. A jumper includes a geometry on a different conductive layer and contacts connecting the geometry on one layer with new layer.

Alternatively, a wire may be rerouted to miss an obstacle in its path. A new path is computed that avoids the obstacle and conductive geometries are placed along the new path. For example, if the path of a wire between a first and second element in the schematic encounters an obstacle element in its path, the distance between the geometry of the first element and the obstacle element is computed and a midpoint determined. In the specific embodiment, the midpoint is a point equidistant between the geometry of the first element and the obstacle element. A new path is calculated from the geometry of the first element to the midpoint, and then perpendicular to a point past the edge of the obstacle element. Once the element has been bypassed, the new path is continued to the second element. Often this will require using two or more perpendicular segments to connect the two elements. If there is no room to make a connection in this manner, the spacing of the layout may expanded to allow more room.

Figure 10B:
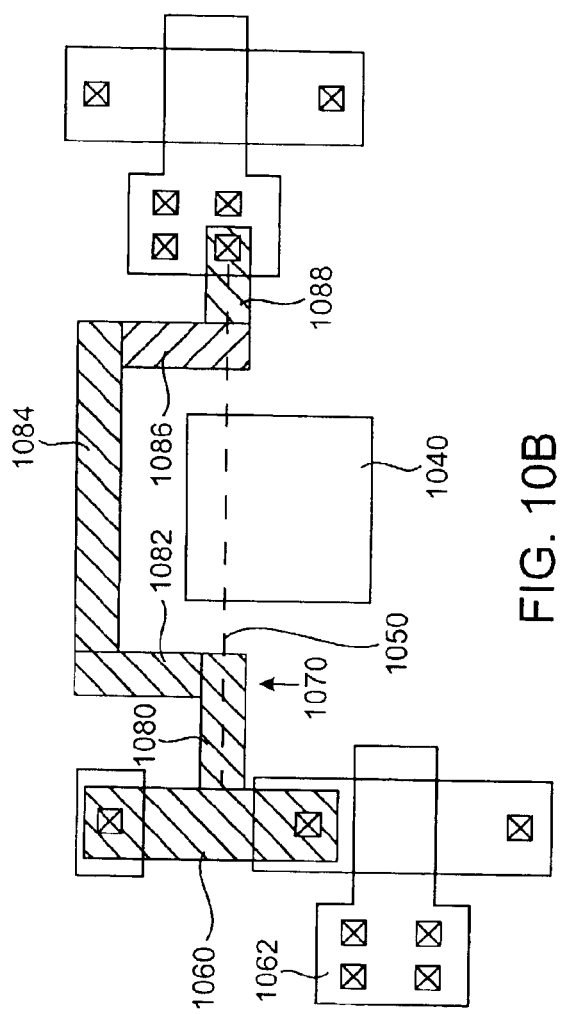
FIGS. 10A and 10B show how interconnect segments may be rerouted if an obstacle is in the path.
Figure 10A:
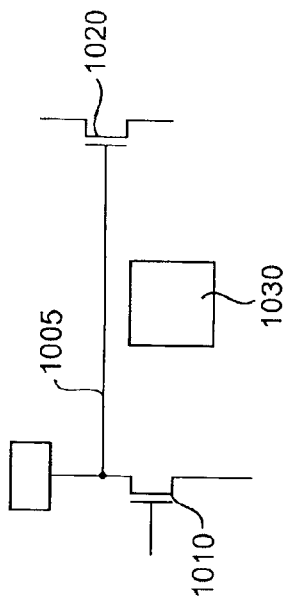

An example of how this may be accomplished is shown in FIG. 10. A connection 1005 from the source of a first element 1010 to a second element 1020 may be drawn as shown in the schematic of FIG. 10A. As is apparent in FIG. 10A, connection 1005 does not cross element 1030. However, when the layout is completed as shown in FIG. 10B, the obstacle geometry 1040 associated with element 1030 lies in a first path 1050 (shown by the dashed line).

The distance between a first geometry 1060 representing the source of element 1010 and obstacle geometry 1040 is computed and a midpoint 1070 determined. A new path is formed with a first segment 1080 from the first geometry 1060 to midpoint 1070 and a second segment 1082 perpendicular to first segment 1080 from midpoint 1070. In the specific embodiment, the distance to the edge of obstacle geometry 1040 is computed and second segment 1082 is formed to be longer than that distance. A third segment 1084 may be formed perpendicular to second segment 1082 to bypass obstacle geometry 1040 and two more segments 1086 and 1088 added to complete the connection to a second geometry representing second element 1020. Of course, other methods of bypassing the obstacle geometry may be conceived and this example is not meant to limit the invention.

Step 940 takes additional time to complete than a direct connection according to the schematic design. If rerouting the connection in step 940 is necessary, the time for doing the layout will increase. Furthermore, this takes control from the designer over the physical layout of the circuit. Therefore, it is desirable to place the objects in the original schematic such that as few as possible of these type of connections need be made.

Another aspect of step 670 involves the orientation of the elements with respect to the X-Y axis. A designer may specify in schematic file 600 that an element is to be oriented in a rotated fashion. Step 670 obtains this information from netlist file 604 and when the element is placed, step 670 rotates it according the specification of the designer.

As mentioned above, a software program of the present invention may be operated on a layout system 100 such as that described in FIGS. 1A and 1B. Schematic file 600, netlist file 604, device file 606, template device description file 610, technology file 612, geometric device description file 660 device library 665, and layout file 675 may be stored in layout system 100. More specifically, these files may be stored in a database on mass storage 117, or accessed through network interface 138. A software program to implement the processes and actions described above may be run on central processor 122. Layout file 675 may be viewed on monitor 103 or printed on a printer using a layout viewer. This is represented as step 699 in FIG. 6A.

While specific examples have been described herein, these examples are given only to aid in the understanding of the invention. No limitations are intended, nor implied by the specification. The invention is intended to be limited only by the attached claims.

What is claimed is:

1. A method of designing an integrated circuit comprising:

selecting first, second, third, and fourth elements to implement a design;

placing said first and second elements in a schematic;

placing an first interconnect segment between the first and second elements in said schematic;

placing said third and fourth elements in said schematic;

placing a second interconnect segment between said third and fourth elements in said schematic;

providing a user-discernable warning if said first interconnect segment crosses said second interconnect segment.

2. The method of claim 1 wherein said first element is said third element.

3. The method of clam 1 further comprising:

rerouting said second interconnect segment if said first interconnect segment crosses said second interconnect segment.

4. A method of designing an integrated circuit comprising:

selecting first, second, third, and fourth elements to implement a design;

placing said first and second elements in a schematic;

placing an interconnect segment between the first and second elements in said schematic;

placing said third element in said schematic;

providing a user-discernable warning if said interconnect segment crosses said third element.

5. The method of claim 4 wherein said first element is said third element.

6. The method of claim 4 wherein said interconnect connect segment is rerouted if said interconnect segment crosses said third element.

\* \* \* \* \*